United States Patent
Stenestam et al.

(10) Patent No.: US 11,574,776 B2
(45) Date of Patent: Feb. 7, 2023

(54) PRESSURE PULSE DIAGNOSTICS OF AN ON-LOAD TAP CHANGER

(71) Applicant: Hitachi Energy Switzerland AG, Baden (CH)

(72) Inventors: Bengt-Olof Stenestam, Ludvika (SE); Lars Jonsson, Västerås (SE)

(73) Assignee: Hitachi Energy Switzerland AG, Baden (CH)

( * ) Notice: Subject to any disclaimer, the term of this patent is extended or adjusted under 35 U.S.C. 154(b) by 0 days.

(21) Appl. No.: 17/614,657

(22) PCT Filed: May 18, 2020

(86) PCT No.: PCT/EP2020/063867
§ 371 (c)(1),
(2) Date: Nov. 29, 2021

(87) PCT Pub. No.: WO2020/239511
PCT Pub. Date: Dec. 3, 2020

(65) Prior Publication Data

US 2022/0148826 A1    May 12, 2022

(30) Foreign Application Priority Data

May 28, 2019    (EP) .................................... 19177143

(51) Int. Cl.
*H01H 9/00*    (2006.01)
*G01R 31/333*    (2006.01)
*H01H 33/668*    (2006.01)

(52) U.S. Cl.
CPC ......... *H01H 9/0038* (2013.01); *G01R 31/333* (2013.01); *H01H 33/668* (2013.01); *H01H 2009/0061* (2013.01)

(58) Field of Classification Search
CPC ............... H01H 9/0038; H01H 33/668; H01H 2009/0061; G01R 31/333
See application file for complete search history.

(56) References Cited

U.S. PATENT DOCUMENTS

| 3,206,569 A | 9/1965 | McCarty |
| 5,786,552 A | 7/1998 | Dohnal et al. |

(Continued)

FOREIGN PATENT DOCUMENTS

| CN | 1489697 A | 4/2004 |
| CN | 201440364 U | 4/2010 |

(Continued)

OTHER PUBLICATIONS

International Search Report and Written Opinion of the International Searching Authority, PCT/EP2020/063867, dated Jul. 23, 2020, 15 pages.

(Continued)

*Primary Examiner* — Harry R Behm
(74) *Attorney, Agent, or Firm* — Sage Patent Group

(57) ABSTRACT

The present invention relates to a method and a monitoring system, for monitoring a vacuum on-load tap changer. The tap changer includes a housing with insulating fluid, a diverter switch inside of the housing and including at least one movable contact and at least two vacuum interrupters, and at least one pressure sensor which measures the pressure in the housing. The method, which is performed by a processing circuitry in the system, includes determining a pressure signature, including two succeeding peaks within a time interval, continuously measuring the pressure, detecting when the measured pressure shows the pressure signature, determining, based on the measured pressure within the pressure signature, the time between the first rise in pressure (Continued)

and the second drop, and setting the determined time to represent the switch time of the diverter switch.

17 Claims, 5 Drawing Sheets

(56) References Cited

U.S. PATENT DOCUMENTS

| | | | |
|---|---|---|---|
| 7,145,760 | B2 | 12/2006 | Stenestam et al. |
| 9,442,150 | B2 | 9/2016 | Jain |
| 2005/0099741 | A1* | 5/2005 | Stenestam ............ G01R 31/333 361/1 |
| 2013/0158897 | A1* | 6/2013 | Jain ...................... H01F 27/402 702/42 |
| 2014/0085028 | A1 | 3/2014 | Hammer et al. |
| 2014/0286273 | A1 | 6/2014 | Suzuki et al. |
| 2016/0322151 | A1 | 11/2016 | Larsson |

FOREIGN PATENT DOCUMENTS

| | | | |
|---|---|---|---|
| CN | 102460624 | A | 5/2012 |
| CN | 103398830 | A | 11/2013 |
| CN | 104737249 | A | 6/2015 |
| CN | 204884832 | U | 12/2015 |
| CN | 208889457 | U | 5/2019 |
| KR | 1019840008521 | A | 12/1984 |
| KR | 1020100021481 | A | 2/2010 |
| KR | 1020120056815 | A | 6/2012 |
| KR | 1020170138550 | A | 12/2017 |
| KR | 1020210149226 | A | 12/2021 |
| TW | 201432237 | A | 8/2014 |
| WO | WO-2009130201 | A * | 10/2009 ........... H02H 1/0015 |
| WO | WO 2012097957 | A1 | 7/2012 |

OTHER PUBLICATIONS

Extended European Search Report, EP19177143.5, dated Nov. 4, 2019, 18 pages.
"Recommendations for Condition Monitoring and Condition Assessment Facilities for Transformers," Working Group A2.27, Apr. 2008, Cigre, 27 pages.
Examination Report, Indian Patent Office, 202147056690, dated Jun. 23, 2022, 6 Pages.
Notification to Grant Patent Right for Invention, Chinese Patent Application No. 202080054564.7, dated Aug. 3, 2022, 5 pages.
Decision for Grant, Korean Patent Application No. 10-2021-7038923, dated Nov. 29, 2022, 4 pages.

* cited by examiner

S1 determining a pressure signature, including two succeeding peaks within a predetermined time interval, the maximum pressure does not exceed a predetermined level S2 continuously measuring the pressure in the housing S3 detecting when the measured pressure shows the pressure signature S4 determining, based on the measured pressure within the pressure signature, the time between the first rise in pressure and the second drop S5 setting the determined time to represent the switch time S6 detecting when the measured pressure shows the pressure signature but where the second peak does not show a succeeding drop S7 activating an alarm that indicates that the vacuum on-load tap changer is malfunctioning and that it has reached a safe position S8 detecting when the measured pressure shows the pressure signature and when the pressure does not exceed a predetermined pressure level S9 activating an alarm that indicates that the vacuum on-load tap changer has had a gas-producing event S10 detecting a pressure pulse with a pressure above a predetermined maximum level S11 activating an alarm that the vacuum on-load tap changer is not operating safely S12 detecting the amount of the static pressure in the housing S13 determining the amount of insulating fluid based on the amount of the static pressure S14 activating an alarm that indicates that the level of insulating fluid in the housing should be adjusted when the determined amount of insulating fluid is outside of a predetermined interval

Fig. 7

PRESSURE PULSE DIAGNOSTICS OF AN ON-LOAD TAP CHANGER

CROSS REFERENCE TO RELATED APPLICATIONS

This application is a 35 U.S.C. § 371 national stage application of PCT International Application No. PCT/EP2020/063867 filed on May 18, 2020, which in turns claims foreign priority to European Patent Application No. 19177143.5, filed on May 28, 2019, the disclosures and content of which are incorporated by reference herein in their entirety.

TECHNICAL FIELD

The present invention relates to a method and a monitoring system for monitoring a vacuum on-load tap changer.

BACKGROUND

A tap changer is a device used with transformers for regulation of the voltage levels. The regulation is achieved by having the tap changer altering the number of turns in the winding of the transformer.

On-load tap changers, OLTC, may comprise a diverter switch and a tap selector switch operating as a unit to effect current transfer from one voltage tap to the next.

The diverter switch does the entire on-load making and breaking of currents, whereas the tap selector preselects the tap to which the diverter switch will transfer the load current. The tap selector operates off load.

When the power output from a transformer is to be changed from one voltage level to another, the change may occur by first connecting the tap selector to that tapping point of the transformer winding which corresponds to the new voltage level while the diverter switch still feeding from the existing voltage level. The connection of the tap selector thus takes place without current load. When the tap selector is connected to the tap for the new voltage level, a switching operation takes place with the aid of the diverter switch such that output current is taken out from the new tapping point of the transformer. When a transformer has a plurality of tapping points, switching normally only occurs between two tapping points which are close to each other in terms of voltage. If an adjustment to a more distant location should be required, this takes place step by step.

A diverter switch of the kind referred to here may be normally used for control of power or for distribution transformers. The OLTC may also advantageously be used for control of other types of electrical devices, such as, power transmission or distribution products, such as reactors, industrial transformers, phase shifters, capacitors or the like.

The operation of the diverter switch involves commutation from one circuit to another with ensuing occurrence of an electric arc. The diverter switch, together with all subsystems, is placed in a housing and submerged in an insulating fluid, such as oil. The OLTC comprises the housing together with insulating fluid, diverter switches and subsystems.

The insulating fluid in the tank acts as electric insulator and as a coolant to remove the generated heat in the OLTC. The insulating fluid will also quench the arcs generated during switching. Arcing during the operation of the OLTC will pollute the insulating fluid and wear the switch contacts.

To overcome arcing in the insulating fluid, it is previously known to use vacuum switches or, in other words, vacuum interrupters for those switching operations where an arc arises. The electrical contact wear and arcs will then only arise in the vacuum interrupter. For an appropriate procedure from an electrical point of view, a diverter switch of this kind is provided with at least one main branch and one resistance branch, each with a vacuum interrupter.

A diverter switch of the above kind is previously known from, for example, U.S. Pat. No. 5,786,552. The diverter switch described therein has one main branch and one resistance branch, in the steady state connected in parallel and connected to an output line. Each branch is provided with a vacuum interrupter and a contact connected in series therewith. These are operated in a definite sequence when diverter switching is to take place, in which case it is important to ensure that the main branch is operated before the resistance branch for the OLTC. For some load interrupters, the main branch is not operated before the resistance branch. The vacuum interrupter of the main branch may be dimensioned for breaking of the load current only and the vacuum interrupter of the resistance branch for the circulating current that arises. In case of the reverse sequence, the vacuum interrupter of the main branch would be forced to break the sum of these currents and thus be dimensioned therefore.

U.S. Pat. No. 3,206,569 illustrates a tap changer provided with vacuum interrupters. The tap changer is connected to a main transformer. The tap changer is separated from the transformer and is provided in the same container and liquid as the transformer or in a separate container and separate liquid. A hood provided for collecting gas is arranged above the tap changer, and the hood is adapted to convey gas to a gas sensor. The gas sensor is of a type that senses hydrogen and hydrocarbon gases. If the vacuum interrupter fails, the contactors open and draw an arc that produces a gas bubble. The hydrogen gas is detected by the sensor, which gives an alarm. In this way the alarm indicates that the vacuum interrupter is malfunctioning.

In case of a vacuum interrupter failure, the auxiliary contact system in the OLTC is capable of breaking the current a limited number of times, depending on OLTC type and load, possibly between 10 to 500 times. If the auxiliary contact system, i.e. the movable contact of the diverter switch, has to break the current more than the limit number of times, the wear caused by arcs leads to that the contacts no longer connect and lead current. If auxiliary main contacts cannot connect, two things can happen:

1. The main circuit is interrupted, and the load is carried over the resistance circuit. With the continuous full load on the transition resistor, the resistor will eventually melt and break with a growing arc inside the OLTC as a result. This arc will hopefully be detected and should result in an immediate emergency shut-down of the OLTC-transformer system. A long repair or exchange of the diverter switch will be the result and during the repair time the transformer will be off-line.

2. A standing arc appears over auxiliary contacts which could lead to a short circuit between two phases which will lead to a catastrophic failure, e.g. explosion or fire. If one is lucky, the standing arc is quenched and one is back to point 1.

As previously explained, when an OLTC fails, there is a risk of explosion or fire. Therefore, there is always a need for improving the control of an OLTC to avoid such failures.

SUMMARY

It is an aim of the present invention to provide an improved method and monitoring system for monitoring a vacuum on-load tap changer.

Some embodiments provide that this aim is achieved by a method as defined in claim 1 and a monitoring system as defined in claim 7.

The disclosure provides a method, for monitoring a vacuum on-load tap changer. The tap changer comprises a housing filled with insulating fluid, a diverter switch arranged inside of the housing and comprising at least one movable contact (MC, RC) and at least two vacuum interrupters (MV, RV) for interrupting a current through the at least one movable contact and at least one pressure sensor which measures the pressure in the housing. The method comprises: determining a pressure signature including two succeeding peaks within a predetermined time interval and where the maximum pressure does not exceed a predetermined level, continuously measuring the pressure in the housing with the pressure sensor, detecting when the measured pressure shows the pressure signature, determining, based on the measured pressure within the pressure signature, the time between the first rise in pressure and the second drop, and setting the determined time to represent the switch time of the diverter switch. With this method, the switch time can be determined. By determining the switch time, slow operation can be detected. Slow operation can overheat the tap-changer and lead to a failure at severe overheating. It is recommended in the CIGRE publication "Recommendations for Condition Monitoring and Condition Assessment Facilities for Transformers WG A2.27" from April 2008, under 7.6.3, that the operation time of diverter switches should be determined. The method provides a solution to the recommendation.

According to some aspects, the method comprises detecting when the measured pressure shows the pressure signature but where the second peak does not show a succeeding drop, and activating an alarm that indicates that the vacuum on-load tap changer is malfunctioning and that it has reached a safe position. An operator can thus be informed that the OLTC is malfunctioning but that it has reached a safe position where the second vacuum interrupter did not close. Appropriate actions can then be taken by the operator.

According to some aspects, the method comprises detecting when the measured pressure shows the pressure signature and when the pressure at the peaks does not exceed a predetermined pressure level, and activating an alarm that indicates that the vacuum on-load tap changer has had a gas-producing event. An operator can then take appropriate action. If the pressure at the peaks is lower than the predetermined level for a predetermined number of operations, the OLTC may be shut down, because the free gas in the diverter switch has not been removed.

According to some aspects, the method comprises detecting a pressure pulse with a pressure above a predetermined maximum level, and activating an alarm that the vacuum on-load tap changer is not operating safely. The operator is thus alerted that the OLTC is malfunctioning in an unsafe way. According to some aspects, the OLTC may be immediately shut down when detecting a pressure above a predetermined maximum level.

According to some aspects, the method comprises detecting the amount of the static pressure in the housing, and determining the amount of insulating fluid based on the amount of the static pressure. There will always be some pressure in the housing, even when there are no pressure peaks. That static pressure may change over time if the amount of insulating fluid changes in the housing. Variations in the static pressure thus gives an indication of the amount of insulating fluid in the housing.

According to some aspects, the method comprises activating an alarm that indicates that the level of insulating fluid in the housing should be adjusted when the determined amount of insulating fluid is outside of a predetermined interval. There is thus an alarm when the static pressure has changed so much that an operator needs to be informed.

The disclosure provides a monitoring system for a vacuum on-load tap changer comprising a housing filled with insulating fluid, a diverter switch arranged inside of the housing and comprising at least one movable contact (MC, RC) and at least two vacuum interrupters (MV, RV) for interrupting a current through the at least one movable contact. The monitoring system comprises at least one pressure sensor which measures the pressure in the housing and processing circuitry. The processing circuitry being arranged to determine a pressure signature including two succeeding peaks within a predetermined time interval and where the maximum pressure does not exceed a predetermined level, continuously measure the pressure in the housing with the pressure sensor, detect when the measured pressure shows the pressure signature, and to determine, based on the measured pressure within the pressure signature, the time between the first rise in pressure and the second drop, and setting the determined time to represent the switch time of the diverter switch. The monitoring system has the same advantages as the previously discussed method. The same goes for the below features.

According to some aspects, the processing circuitry is further arranged to detect when the measured pressure shows the pressure signature but where the second peak does not show a succeeding drop, and to activate an alarm that indicates that the vacuum on-load tap changer is malfunctioning and that it has reached a safe position.

According to some aspects, the processing circuitry is further arranged to detect when the measured pressure shows the pressure signature and when the pressure at the peaks does not exceed a predetermined pressure level, and to activate an alarm that indicates that the vacuum on-load tap changer has had a gas-producing event.

According to some aspects, the processing circuitry is further arranged to detect a pressure pulse with a pressure above a predetermined maximum level, and to activate an alarm that the vacuum on-load tap changer is not operating safely.

According to some aspects, the processing circuitry is further arranged to detect the amount of the static pressure in the housing, and to determine the amount of insulating fluid based on the amount of the static pressure.

According to some aspects, the processing circuitry is further arranged to activate an alarm that indicates that the level of insulating fluid in the housing should be adjusted when the determined amount of insulating fluid is outside of a predetermined interval.

BRIEF DESCRIPTION OF THE DRAWINGS

The invention will now be explained more closely by the description of different embodiments of the invention and with reference to the appended figures.

FIG. 7 shows a block diagram of a method for monitoring an OLTC.

DETAILED DESCRIPTION

Figure 1:
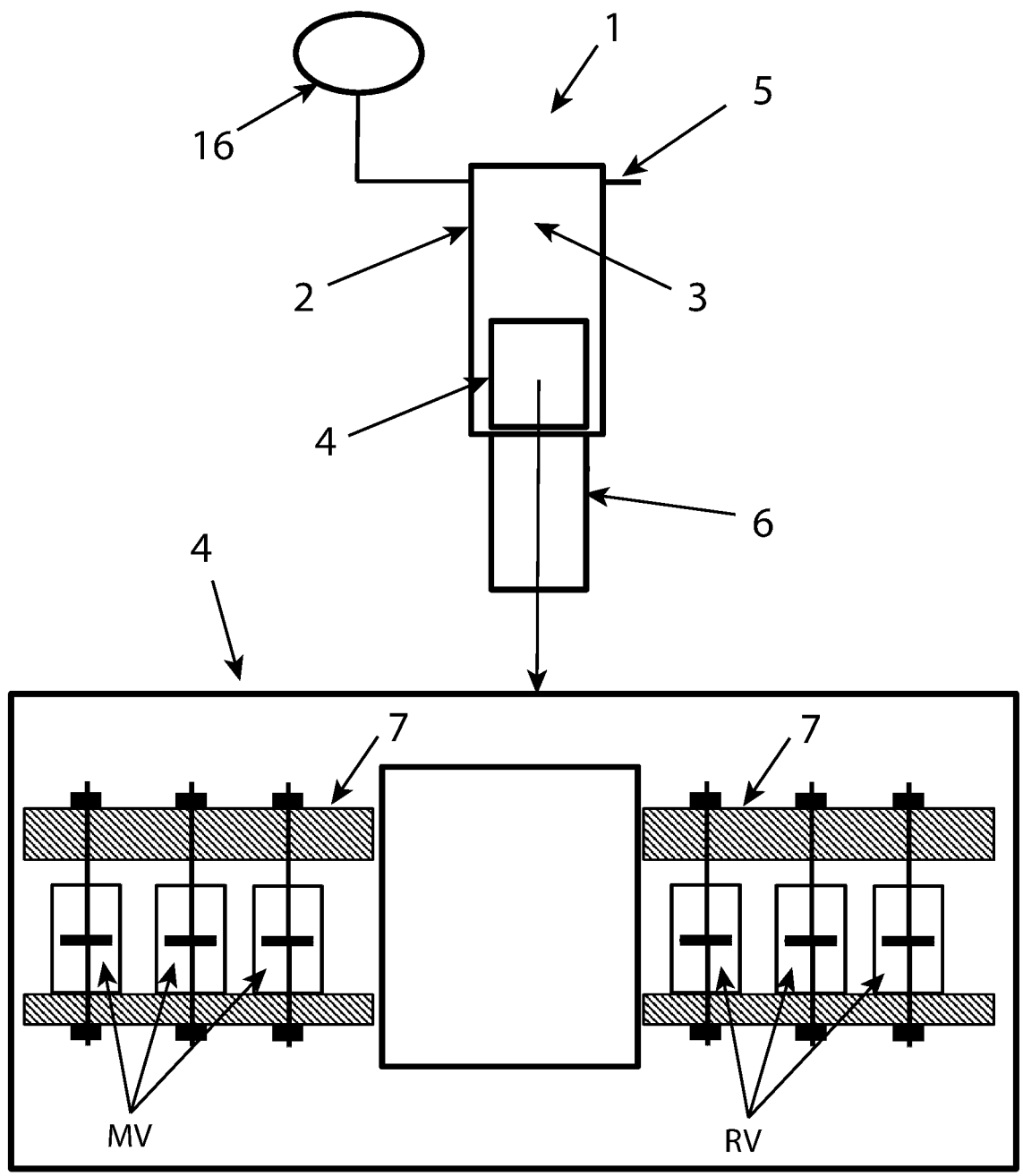
FIG. 1 shows an example of a vacuum type of tap changer with a zoomed-in view of the diverter switch.

Aspects of the present disclosure will be described more fully hereinafter with reference to the accompanying drawings. The devices and methods disclosed herein can, however, be realized in many different forms and should not be construed as being limited to the aspects set forth herein. Like numbers in the drawings refer to like elements throughout.

The terminology used herein is for the purpose of describing particular aspects of the disclosure only and is not intended to limit the invention. As used herein, the singular forms "a", "an" and "the" are intended to include the plural forms as well, unless the context clearly indicates otherwise. Unless otherwise defined, all terms (including technical and scientific terms) used herein have the same meaning as commonly understood by one of ordinary skill in the art to which this disclosure belongs.

The term "alarm" here means any kind of notification to an operator or user. The notification can be of any type, such as a sound alarm, an SMS, a visual alarm or any combinations thereof. The alarm may be different at different stations and use the standard alarm system that any specific station is using.

The disclosure provides a method and a monitoring system 10, for monitoring a vacuum on-load tap changer, OLTC. FIG. 1 shows an example of a vacuum type tap changer with a zoomed-in view of a diverter switch 4. In the example, it is shown that the OLTC 1 has a housing 2 with insulating fluid 3, a diverter switch 4, a pressure sensor 5 and a tap selector 6. The zoomed-in diverter switch 4 shows a white square in the middle. The white square represents parts of the diverter switch 4 that are not necessary to show for the purposes of this disclosure. On the sides of the white square, vacuum interrupters MV, RV are illustrated. There are three interrupters MV and three interrupters RV, one for each phase in the illustrated example. The disclosure is also applicable to single phase and two phases. The vacuum interrupters MV, RV are opened and closed by a yoke 7. Please note that the yoke opening all three vacuum interrupters at the same time is an example of how to open and close the vacuum interrupters. Other ways are possible.

Figure 2:
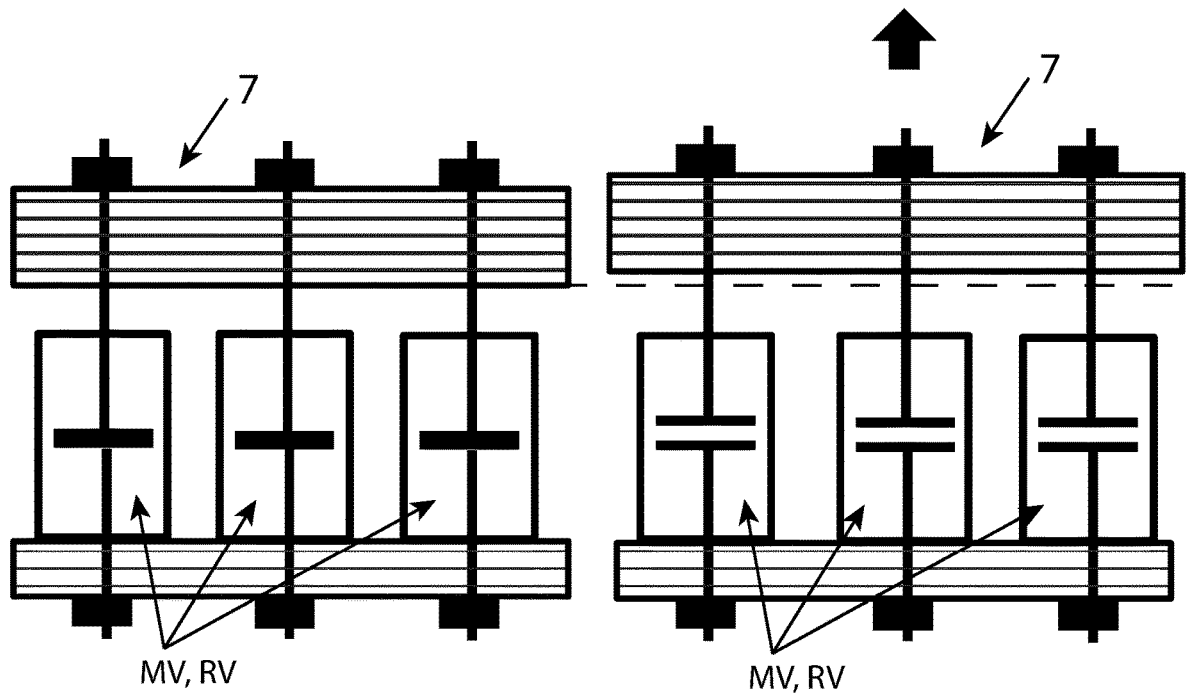
FIG. 2 shows a simplified vacuum interrupter design where two sets of three vacuum interrupters, one for each phase, are opened and closed simultaneously by a yoke.

In FIG. 2, a simplified vacuum interrupter design is shown, where two sets of three vacuum interrupters MV, RV, one for each phase, are opened and closed simultaneously by a yoke 7. In the left part of the figure, the three vacuum interrupters are closed and in the right part, they are opened.

FIGS. 3a-k shows a simplified step-by-step process of changing tap in an OLTC 1. The movable contact of the diverter switch 4 is in this case, the rotatable main auxiliary contact MC, on a main side of the diverter switch 4, and the resistor auxiliary contact RC, on a resistor side of the diverter switch 4. The figures show a simplified view of an OLTC 1 for illustrative purposes. Please note that there are OLTCs with only one moveable contact. Arrows indicate the current path through the OLTC 1. As can be seen to the left at the tap winding 8, a connection over T1 gives different amount of tap winding turns than a connection over T2.

Figure 3A:
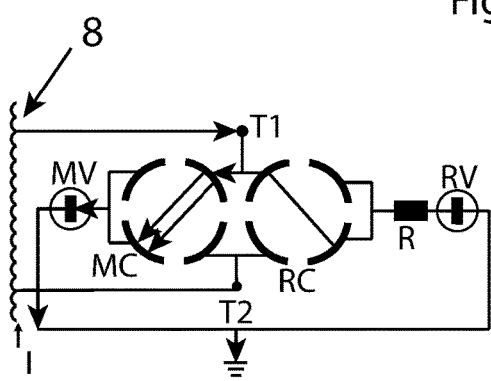
FIG. 3a-k shows a simplified step-by-step process of changing tap in an OLTC.
Figure 3B:
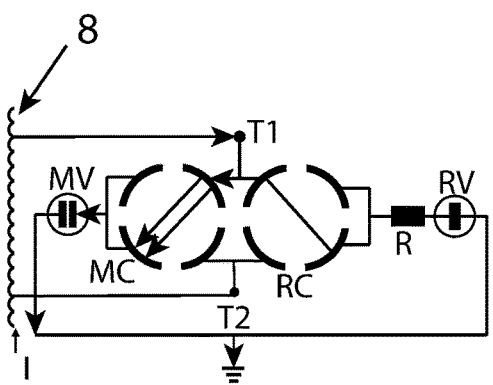
Figure 3C:
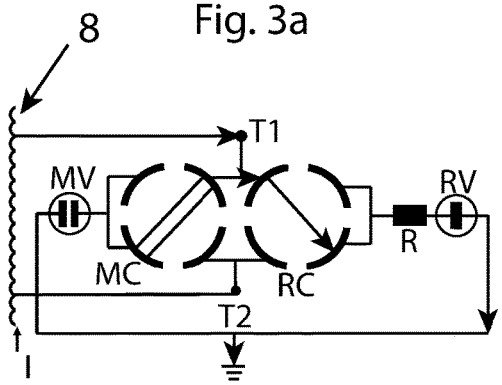
Figure 3D:
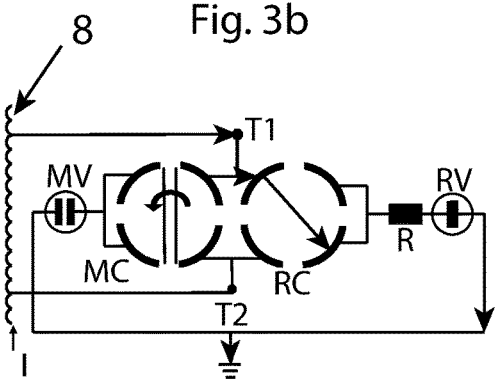
Figure 3E:
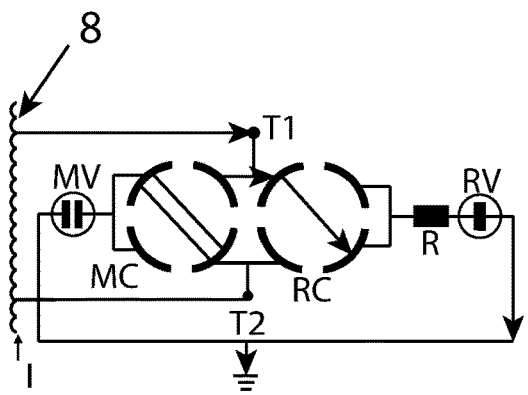
Figure 3F:
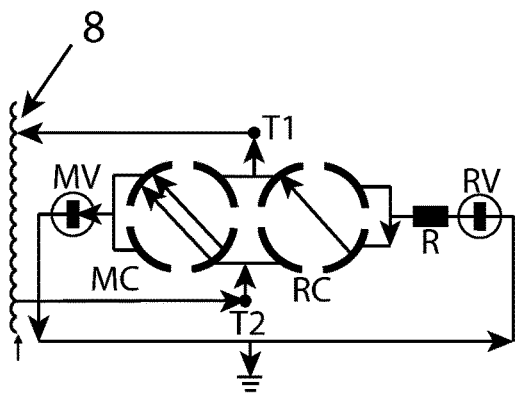
Figure 3G:
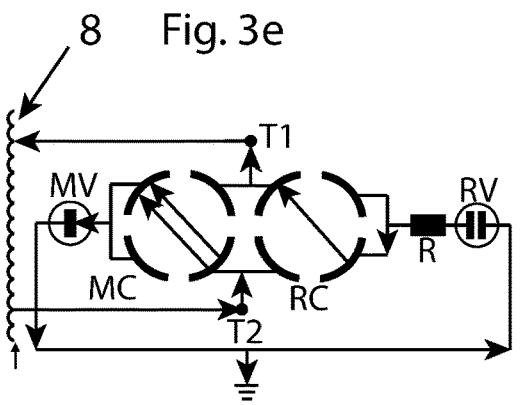
Figure 3H:
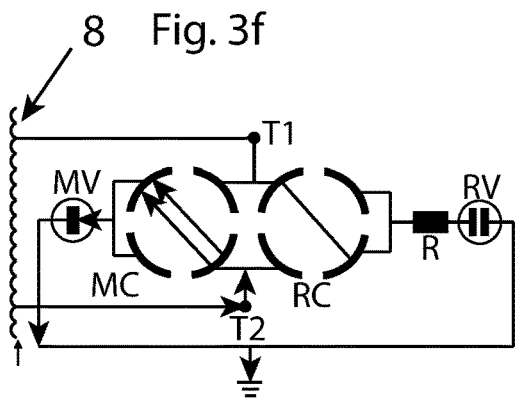
Figure 3I:
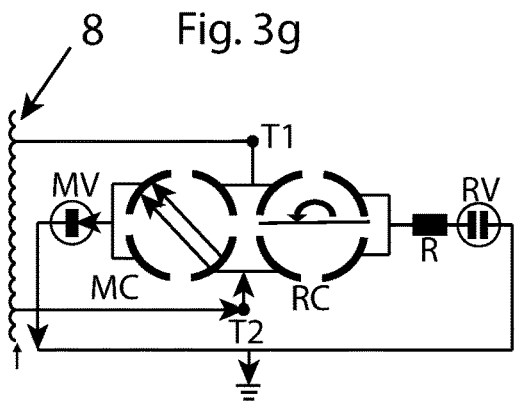
Figure 3J:
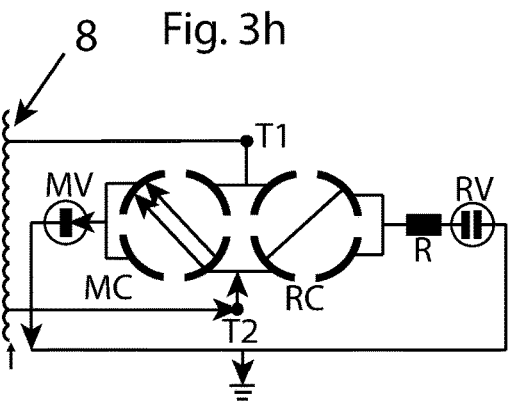
Figure 3K:
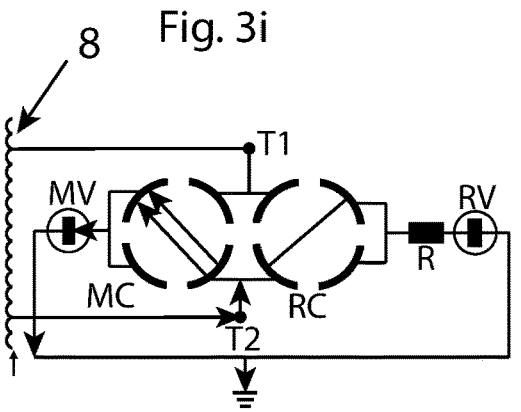

In FIG. 3a, a service position for tap T1 is shown. The steps to switch to tap T2 are shown in FIGS. 3b-k. In FIG. 3b, the main vacuum interrupter MV, is opened and there is an arc in the vacuum bottle. When the arc has stopped, all current will go through the resistor side, as shown in FIG. 3c. Keeping the main vacuum interrupter MV open, the main auxiliary contact MC is now turned, as shown in FIG. 3d. The main auxiliary contact MC is now fully turned to connect to tap T2, but the main vacuum interrupter MV is still open so that the current still goes through the resistor side, as shown in FIG. 3e. The main vacuum interrupter MV now closes, the load current now goes in the MV and a circulating current starts through MV and RV due to the voltage difference between T1 and T2, as shown in FIG. 3f. In the next step, shown in FIG. 3g, the resistor vacuum interrupter RV is opened and there is an arc in it due to the circulating current. The load current is not affected by this and remains the same. When the arc has stopped, the circulating current path through T1 is stopped. The load current continue to go through T2 as shown in FIG. 3h. The resistor auxiliary contact RC is now rotated as shown in FIG. 3i. In FIG. 3j, the resistor auxiliary contact RC is in position, but the resistor vacuum interrupter RV is still open. It is closed in the next step as shown in FIG. 3k, which is the service position for tap T2. In the figures, the resistor side also has a connected resistor R.

Figure 4:
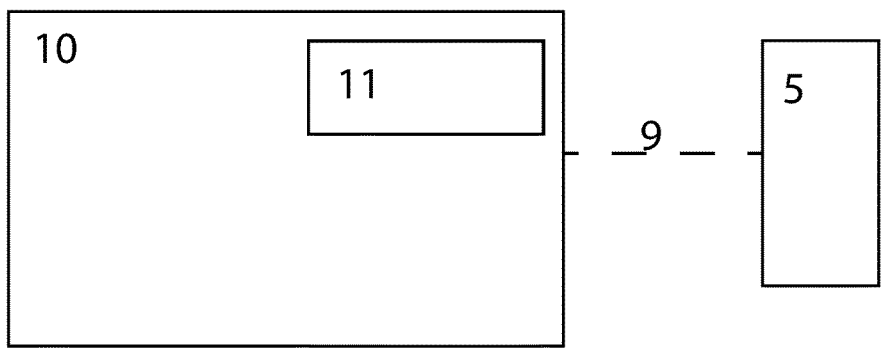
FIG. 4 shows an illustration of a monitoring system.

FIG. 4 shows an illustration of a monitoring system 10 for a vacuum on-load tap changer 1. As previously described, the OLTC 1 comprises a housing 2 filled with insulating fluid 3, a diverter switch 4 arranged inside of the housing 2 and comprising at least one movable contact MC, RC and at least two vacuum interrupters MV, RV for interrupting a current through the at least one movable contact. It should be noted that the at least one moveable contact may be a moveable in a non-physical manner. That is, the at least one moveable contact may be moveable in the sense that an electrical system for example redirects the current to move the contact.

The monitoring system 10 comprises at least one pressure sensor 5 which measures the pressure in the housing 2 for detecting opening and closing of the at least two vacuum interrupters MV, RV and processing circuitry 11. The pressure sensor 5 is also illustrated in FIG. 1, where it is arranged in an upper part of the housing 2 of the OLTC 1. The pressure sensor may be placed on the side of the upper part of the diverter switch housing. It can also be placed on the cover, i.e. the top, of the diverter switch housing. The processing circuitry 11 receives the sensor data from the pressure sensor 5 via some kind of communication means 9. The communication means may be any kind of communication, wired communication or wireless communication via, for example, Wi-Fi, Bluetooth, Z-wave or Zigbee. Alternatives for the communication between the processing circuitry 11 and the pressure sensor 5 are known to the skilled person and will not be further discussed.

Figure 5:
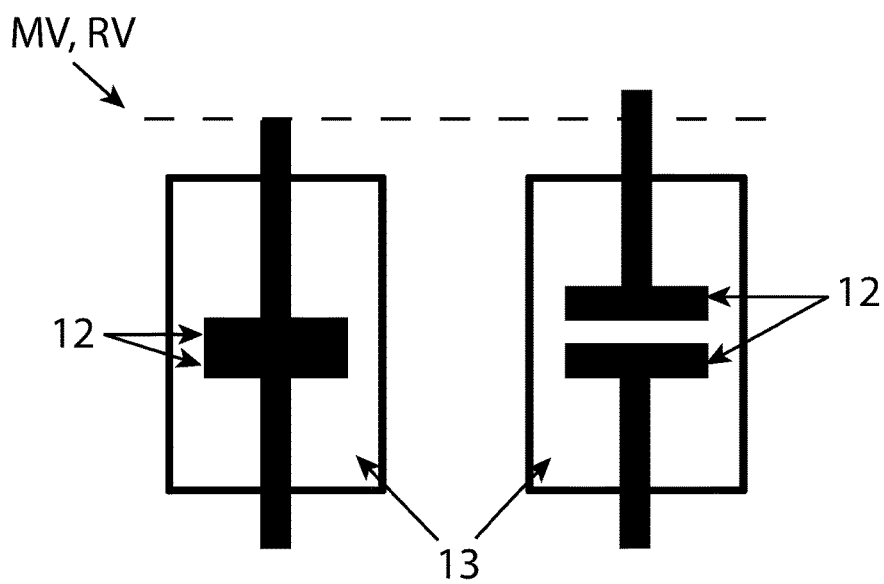
FIG. 5 shows a simplified vacuum interrupter design.

In FIG. 5, an example vacuum interrupter is shown in a closed position to the left and an open position to the right. The contacts 12 are abutting in the closed position and are separated in the open position. In the housing 2 around the contacts, there is vacuum 13. As can be seen in the figure, the volume that the vacuum interrupter uses in the OLTC 1 increases when the vacuum interrupter is opened. The pressure in the insulating fluid 3 thus increases when a vacuum interrupter is opened.

Figure 6:
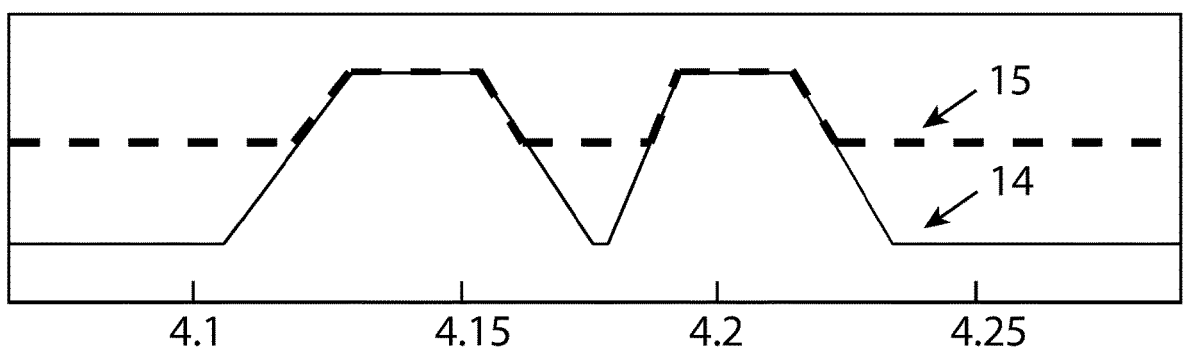
FIG. 6 shows a graph of the pressure measured in the housing when the OLTC changes tap.

The processing circuitry 11 is arranged to determine a pressure signature 14 including two succeeding peaks within a predetermined time interval and where the maximum pressure does not exceed a predetermined level. The determining may be to read the pressure signature 14 from a memory or otherwise receive it from an external source. An example pressure signature 14 is illustrated in FIG. 6. The illustrated pressure signature 14 is from a set-up as illustrated in FIG. 1, with two yokes 7 opening and closing a respective set of three vacuum interrupters. The pressure signature 14 is the result of the yoke 7 movement and the volume increase of the vacuum interrupters 15. The numbers on the x-axis represent time in seconds. And the y-axis is the amount of pressure. The amount of pressure and the time will vary between OLTCs 1 and are only for illustrative purposes. The pressure signature 14 with two succeeding peaks, where both peaks are within a predetermined time interval, is indicative of that a switch between two taps has been performed in the OLTC 1. When the pressure first rises on the first peak, the main vacuum interrupter has been opened, see FIG. 3b. The pressure drops when the main vacuum interrupter closes, see FIG. 3f. The second peak is when the resistor vacuum interrupter opens, see FIG. 3g, and closes, see FIG. 3k.

The processing circuitry 11 continuously measures the pressure in the housing 2 with the pressure sensor 5 and detects when the measured pressure shows the pressure signature 14. A tap switch has thus taken place. The processing circuitry 11 then determines, based on the measured pressure within the pressure signature 14, the time between the first rise in pressure and the second drop, and setting the determined time to represent the switch time of the diverter switch 4. With this monitoring system 10, the switch time can thus be determined. By determining the switch time, slow operation can be detected.

A method for monitoring a vacuum on-load tap changer 1, OLTC, is illustrated in FIG. 7. The boxes with a solid line illustrate steps of the method in the broadest embodiment and the boxes with dashed lines represent alternative steps. It should be noted that the steps may occur out of the illustrated order. The method comprises determining a pressure signature 14 including two succeeding peaks within a predetermined time interval and where the maximum pressure does not exceed a predetermined level, continuously measuring the pressure in the housing 2 with the pressure sensor 5, detecting when the measured pressure shows the pressure signature 14, determining, based on the measured pressure within the pressure signature 14, the time between the first rise in pressure and the second drop, and setting the determined time to represent the switch time of the diverter switch 4. The steps of the method are thus the same as the steps of the processing circuitry 11 in the monitoring system 10 and with the same advantages.

There are several other things that may be detected with the monitoring system 10 and the pressure sensor 5. According to some aspects, the processing circuitry 11 is arranged to detect when the measured pressure shows the pressure signature 14 but where the second peak does not show a succeeding drop, and to activate an alarm that indicates that the vacuum on-load tap changer 1 is malfunctioning and that it has reached a safe position. The method may also comprise the same steps. That the second peak does not show a drop is indicative of that the second vacuum interrupter did not close. In other words, the OLTC 1 is stuck in the position as shown in FIG. 3j which is a safe position. As previously explained, an alarm is any kind of indication to an operator of the OLTC 1. An operator can thus be informed that the OLTC 1 is malfunctioning but that it has reached a safe position where the RV vacuum interrupter did not close. Appropriate actions can then be taken by the operator. Example actions are to take an oil sample, check the gas content (DGA) and stop the operation of the tap-changer. An additional step may be setting a status of the vacuum on-load tap changer 1 to malfunctioning in a safe position.

When unwanted arcing occurs in the OLTC 1, gas is produced. There may thus be gas in the housing 2. According to some aspects, the processing circuitry 11 is arranged to detect when the measured pressure shows the pressure signature 14 and when the pressure at the peaks does not exceed a predetermined pressure level, and to activate an alarm that indicates that the vacuum on-load tap changer 1 has had a gas-producing event. The method may also comprise the same steps. An operator can then take appropriate action. If the pressure at the peaks is lower than the predetermined level for a predetermined number of operations, the OLTC 1 may be blocked for operating, because the free gas in the housing 2 has not been removed. When there is gas in the housing 2, the peaks of the pressure signature 14 will not be as high as when there is no gas in the housing 2, therefore it is possible to detect gas in the housing 2 by determining that the pressure at the peaks is lower than normal, when there is no gas. An additional step may be setting a status of the vacuum on-load tap changer 1 to malfunctioning with gas in the housing 2.

Unexpected pressure pulses in an OLTC 1 may lead to a dangerous situation where there is an explosion. An unexpected pressure pulse above the level that the vacuum interrupters should give can indicate arcing in oil at some point in the diverter switch. There should be no arcing in oil that gives rise to this kind of pressure pulses in a vacuum type of tap-changer. If a vacuum interrupter fails to break, it will, in most cases, be the auxiliary contact related to that vacuum interrupter break that cause an arc. Thus, according to some aspects, the processing circuitry 11 is further arranged to detect a pressure pulse with a pressure above a predetermined maximum level, and to activate an alarm that the vacuum on-load tap changer 1 is not operating safely. The method may also comprise the same steps. The operator is thus alerted that the OLTC 1 is malfunctioning in an unsafe way. According to some aspects, the OLTC 1 is immediately shut down when detecting a pressure above a predetermined maximum level. An additional step may be setting a status of the vacuum on-load tap changer 1 to dangerously malfunctioning.

The amount of insulating fluid 3 in the housing 2 may slowly decrease over time, due to, for example, leaks. In some OLTCs, there are systems for refilling the insulating fluid 3 from a conservator 16 placed above the OLTC. According to some aspects, the processing circuitry 11 is further arranged to detect the amount of the static pressure in the housing 2, and to determine the amount of insulating fluid 3 based on the amount of the static pressure. The static pressure is thus used to determine how much insulating fluid 3 there is in the housing 2 and alternatively the conservator 16 since the static pressure will decrease if the amount of insulating fluid 3 decreases. There will always be some pressure in the housing 2, even when there are no pressure peaks. That static pressure may change over time if the amount of insulating fluid 3 changes in the housing 2. Variations in the static pressure thus gives an indication of the amount of insulating fluid 3 in the housing 2. The information can be used to determine how much insulating fluid 3 should be refilled and when. The method may also comprise the same steps. An additional step may be setting a status of the vacuum on-load tap changer 1 to that it needs more insulating fluid 3.

If it has been detected over a long time that there is not enough insulating fluid 3 in the housing 2, there may be a need for activating an alarm. According to some aspects, the processing circuitry 11 is further arranged to activate an alarm that indicates that the level of insulating fluid 3 in the housing 2 should be adjusted when the determined amount of insulating fluid 3 is outside of a predetermined interval. The method may also comprise the same step. There is thus an alarm when the static pressure has changed so much that an operator needs to be informed.

The present invention is not limited to the embodiments disclosed but may be varied and modified within the scope of the following claims.

REFERENCE LIST

1. Vacuum On-Load Tap Changer, OLTC
2. Housing
3. Insulating fluid
4. Diverter switch
T1=One tap on the tap winding
T2=Another tap on the tap winding
RV=Resistor vacuum interrupter
MV=Main vacuum interrupter
RC=Resistor auxiliary contact
MC=Main auxiliary contact
R=Resistor
5. Pressure sensor
6. Tap selector
7. Yoke
8. Tap winding
9. Communication means
10. Monitoring system
11. Processing circuitry
12. Contact
13. Vacuum
14. Pressure signature
15. Pressure increase by vacuum interrupter movement
16. Conservator

The invention claimed is:

1. A method, for monitoring a vacuum on-load tap changer, wherein the vacuum on-load tap changer comprises:
  a housing filled with insulating fluid,
    a diverter switch arranged inside of the housing and comprising at least one movable contact and at least two vacuum interrupters comprising a main vacuum interrupter and a resistor vacuum interrupter for interrupting a current through the at least one movable contact,
    at least one pressure sensor which measures pressure in the housing,
  wherein the method comprises:
    determining a pressure signature, including two succeeding peaks within a predetermined time interval, a first of the peaks corresponding to the main vacuum interrupter being open and a second of the peaks corresponding to the resistor vacuum interrupter being open, and
    where maximum pressure does not exceed a predetermined pressure level,
    continuously measuring the pressure in the housing with the pressure sensor, for detecting opening and closing of the main vacuum interrupter and the resistor vacuum interrupter,
    wherein the pressure increases when a respective of the vacuum interrupters is opened and drops when it closes,
    detecting when measured pressure shows the pressure signature,
    determining, based on the measured pressure within the pressure signature, a time between a first rise in pressure and a second drop, wherein determining comprises reading the pressure signature from a memory and/or external source;
    setting a determined time to represent the switch time of the diverter switch,
    detecting when the measured pressure shows the pressure signature but where the second peak that occurs after the first peak and does not show a succeeding drop, and
    activating an alarm that indicates that the vacuum on-load tap changer is malfunctioning and that it has reached a safe position.

2. The method according to claim 1, comprising:
  detecting when the measured pressure shows the pressure signature and when the pressure at the peaks does not exceed the predetermined pressure level, and
  activating an alarm that indicates that the vacuum on-load tap changer has had a gas-producing event.

3. The method according to claim 1, comprising:
  detecting a pressure pulse with a pressure above a predetermined maximum level, and
  activating an alarm that the vacuum on-load tap changer is not operating safely.

4. The method according to claim 1, comprising:
  detecting an amount of static pressure in the housing, and
  determining an amount of insulating fluid based on an amount of the static pressure.

5. The method according to claim 4, comprising:
  activating an alarm that indicates that a level of insulating fluid in the housing should be adjusted when the determined amount of insulating fluid is outside of a predetermined interval.

6. A monitoring system for a vacuum on-load tap changer comprising a housing filled with insulating fluid, a diverter switch arranged inside of the housing and comprising at least one movable contact and at least two vacuum interrupters comprising a main vacuum interrupter and a resistor vacuum interrupter for interrupting a current through the at least one movable contact, the monitoring system comprising:
  at least one pressure sensor which measures pressure in the housing,
  processing circuitry arranged to:
  determine a pressure signature including two succeeding peaks within a predetermined time interval, a first of the peaks corresponding to the main vacuum interrupter being open and a second of the peaks corresponding to the resistor vacuum interrupter being open, and
  where maximum pressure does not exceed a predetermined pressure level,
  continuously measure the pressure in the housing with the pressure sensor, for detecting opening and closing of the main vacuum interrupter and the resistor vacuum interrupter,
  wherein the pressure increases when a respective of the vacuum interrupters is opened and drops when it closes, detect when measured pressure shows the pressure signature, and to determine, based on the measured pressure within the pressure signature, a time between a first rise in pressure and a second drop, wherein determining comprises reading the pressure signature from a memory and/or external source;

setting a determined time to represent the switch time of the diverter switch, detecting when the measured pressure shows the pressure signature but where the second peak that occurs after the first peak and does not show a succeeding drop, and activating an alarm that indicates that the vacuum on-load tap changer is malfunctioning and that it has reached a safe position.

7. The monitoring system according to claim 6, wherein the processing circuitry is further arranged to:

detect when the measured pressure shows the pressure signature but where the second peak occurs after the first peak and does not show a succeeding drop, and to activate an alarm that indicates that the vacuum on-load tap changer is malfunctioning and that it has reached a safe position.

8. The monitoring system according to claim 6, wherein the processing circuitry is further arranged to:

detect when the measured pressure shows the pressure signature and when the pressure at the peaks does not exceed the predetermined pressure level, and to activate an alarm that indicates that the vacuum on-load tap changer has had a gas-producing event.

9. The monitoring system according to claim 6, wherein the processing circuitry is further arranged to:

detect a pressure pulse with a pressure above a predetermined maximum level, and to activate an alarm that the vacuum on-load tap changer is not operating safely.

10. The monitoring system according to claim 6, wherein the processing circuitry is further arranged to:

detect an amount of static pressure in the housing, and to determine an amount of insulating fluid based on an amount of the static pressure.

11. The monitoring system according to claim 10, wherein the processing circuitry is further arranged to:

activate an alarm that indicates that the level of insulating fluid in the housing should be adjusted when the determined amount of insulating fluid is outside of a predetermined interval.

12. A method, for monitoring a vacuum on-load tap changer, wherein the vacuum on-load tap changer comprises:

a housing filled with insulating fluid, a diverter switch arranged inside of the housing and comprising at least one movable contact and at least two vacuum interrupters comprising a main vacuum interrupter and a resistor vacuum interrupter for interrupting a current through the at least one movable contact, at least one pressure sensor which measures pressure in the housing, wherein the method comprises:

determining a pressure signature, including two succeeding peaks within a predetermined time interval, a first of the peaks corresponding to the main vacuum interrupter being open and a second of the peaks corresponding to the resistor vacuum interrupter being open, and where maximum pressure does not exceed a predetermined level, continuously measuring pressure in the housing with the pressure sensor, detecting when measured pressure shows the pressure signature, determining, based on the measured pressure within the pressure signature, a time between a first rise in pressure and a second drop, wherein determining comprises reading the pressure signature from a memory and/or external source; and setting a determined time to represent the switch time of the diverter switch, detecting when the measured pressure shows the pressure signature but where the second peak that occurs after the first peak and does not show a succeeding drop, and activating an alarm that indicates that the vacuum on-load tap changer is malfunctioning and that it has reached a safe position.

13. The method according to claim 12, comprising:

activating an alarm that indicates that the vacuum on-load tap changer is malfunctioning and that it has reached a safe position.

14. The method according to claim 12, comprising:

activating an alarm that indicates that the vacuum on-load tap changer has had a gas-producing event.

15. The method according to claim 12, comprising:

activating an alarm that the vacuum on-load tap changer is not operating safely.

16. The method according to claim 12, comprising:

detecting an amount of static pressure in the housing; and determining an amount of insulating fluid based on an amount of the static pressure.

17. The method according to claim 16, comprising activating an alarm that indicates that a level of insulating fluid in the housing should be adjusted when the determined amount of insulating fluid is outside of a predetermined interval.

* * * * *